United States Patent
Yoshida

(10) Patent No.: US 7,920,076 B2
(45) Date of Patent: Apr. 5, 2011

(54) RUN LENGTH LIMITER AND RUN LENGTH LIMITING METHOD

(75) Inventor: Kenji Yoshida, Akishima (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 12/561,251

(22) Filed: Sep. 16, 2009

(65) Prior Publication Data

US 2010/0149003 A1 Jun. 17, 2010

(30) Foreign Application Priority Data

Dec. 11, 2008 (JP) ................................ 2008-316065

(51) Int. Cl.
*H03M 7/00* (2006.01)
(52) U.S. Cl. ................ 341/50; 341/51; 341/59; 341/68
(58) Field of Classification Search .................... 341/50, 341/51, 68, 69, 59, 61, 58; 386/46
See application file for complete search history.

(56) References Cited

U.S. PATENT DOCUMENTS

| | | | | |
|---|---|---|---|---|
| 5,508,701 A * | 4/1996 | Nose et al. | | 341/58 |
| 5,627,694 A * | 5/1997 | Ido et al. | | 360/51 |
| 5,790,056 A * | 8/1998 | Schouhamer Immink | | 341/58 |
| 6,445,313 B2 * | 9/2002 | Ahn | | 341/59 |
| 6,492,920 B2 * | 12/2002 | Oki et al. | | 341/106 |
| 6,573,848 B2 * | 6/2003 | Hayami | | 341/68 |
| 6,690,308 B2 * | 2/2004 | Hayami | | 341/68 |
| 6,778,104 B2 * | 8/2004 | Chen et al. | | 341/59 |
| 7,132,967 B2 * | 11/2006 | Hayami | | 341/143 |
| 2002/0093751 A1 | 7/2002 | Hayami | | |
| 2002/0097173 A1 | 7/2002 | Itoi | | |

FOREIGN PATENT DOCUMENTS

| | | |
|---|---|---|
| JP | 10-340543 | 12/1998 |
| JP | 2001-244824 | 9/2001 |
| JP | 2002-141804 | 5/2002 |
| JP | 2005-203094 | 7/2005 |
| JP | 2008-004195 | 1/2008 |

OTHER PUBLICATIONS

Japanese Office Action dated Nov. 17, 2009, Japanese Patent Application No. 2008-316065.
Japanese Office Action dated Feb. 9, 2010, Japanese Patent Application No. 2008-316065.

* cited by examiner

*Primary Examiner* — Jean B Jeanglaude
(74) *Attorney, Agent, or Firm* — Patterson & Sheridan, LLP

(57) ABSTRACT

According to one embodiment, a run length limiter includes a searcher configured to search a received digital data for a specific symbol, an operator configured to operate an exclusive OR operation of the specific symbol and the digital data, and an output module configured to output the exclusive OR operated digital data with the specific symbol.

11 Claims, 13 Drawing Sheets

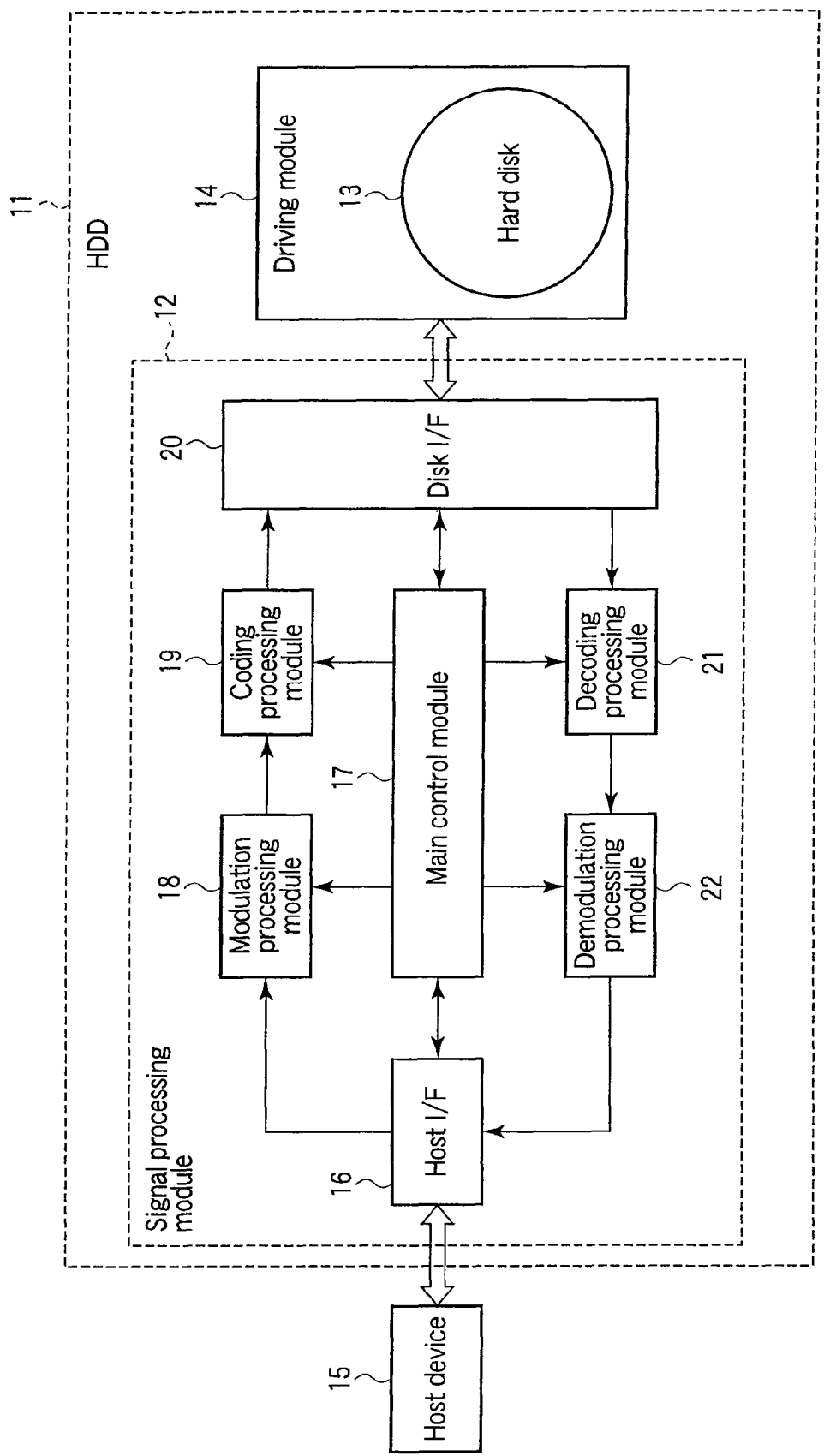
F I G. 1

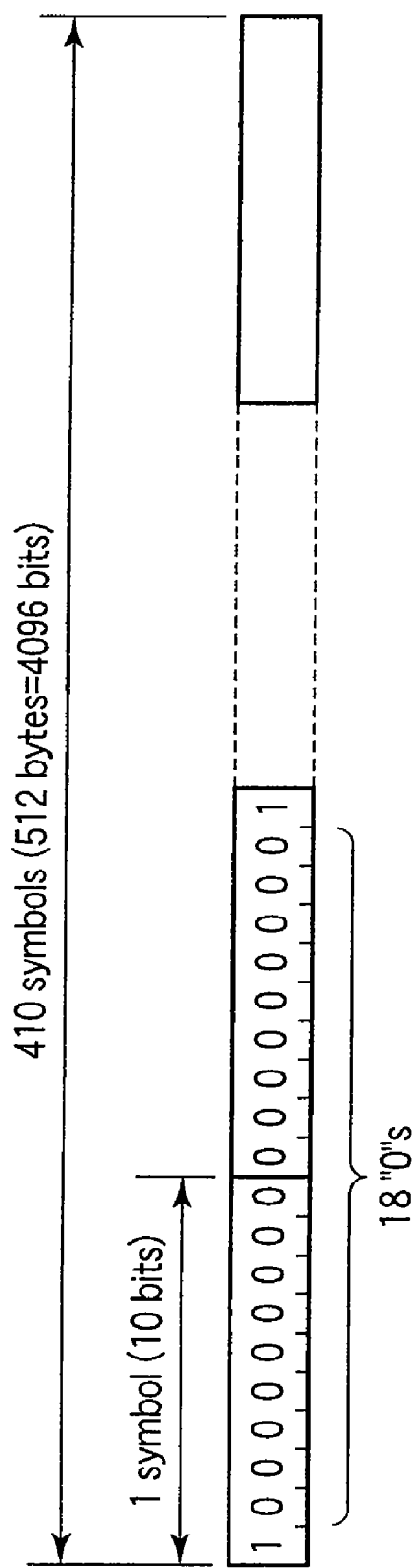
F I G. 2

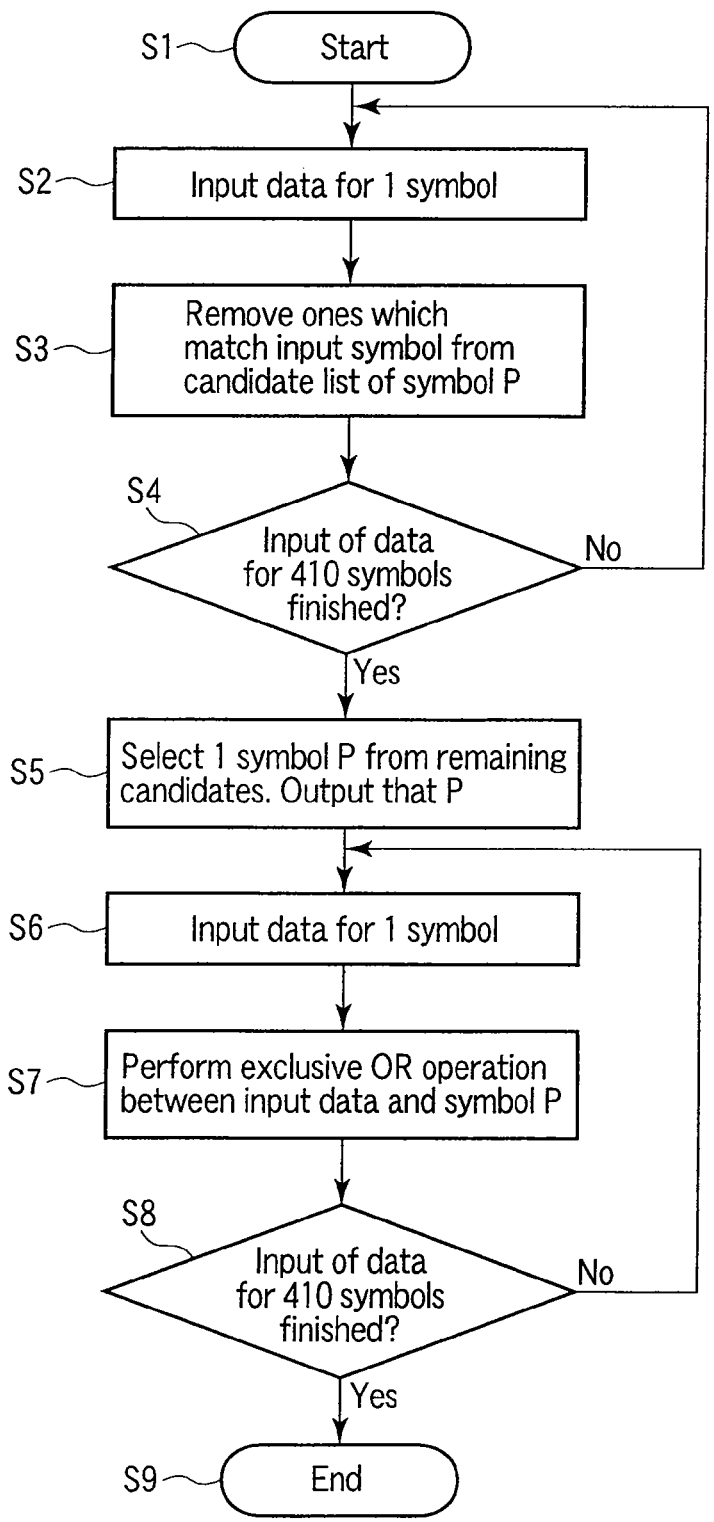
F I G. 4

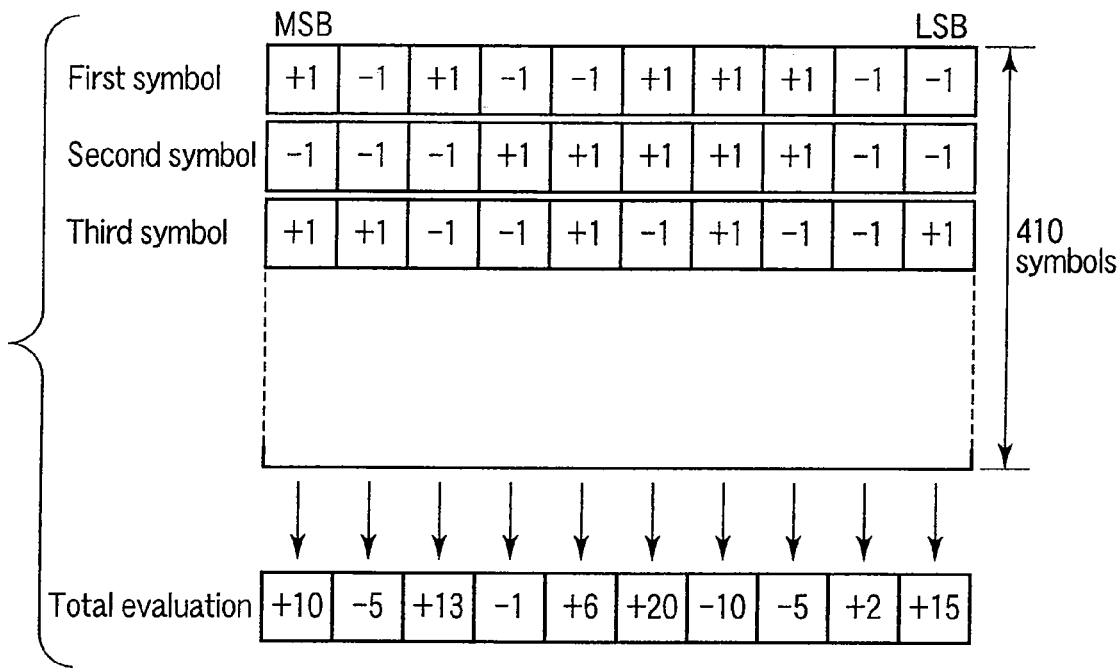
F I G. 6
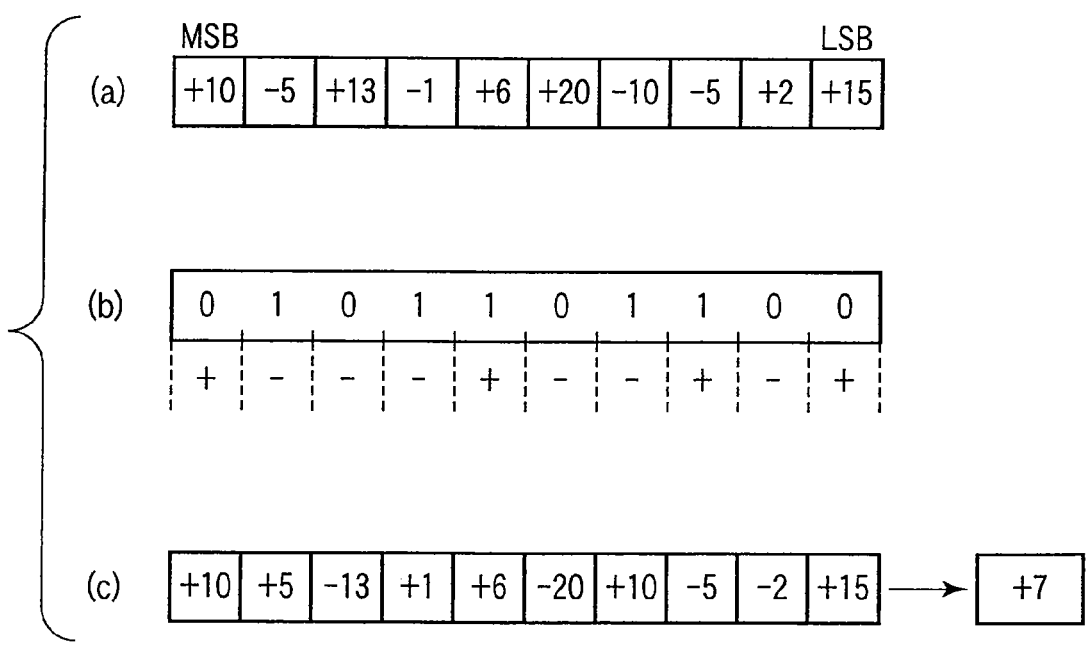
F I G. 7

```
last_bit = 0;
for (i=0;i<DATA_LEN;i++) {
   for(j=SYMBOL_BITS-1;j>=0;J--) {
      this_bit = ( buf[i] & (1<<j) ) >> j;
      if (this_bit) == last_bit ) {
        transition_statistics[j] ++;
      } else {
        transition_statistics[j] --;
      }
      last_bit=this_bit;
   }
}
```

FIG. 9

```
for(i=0; i< NUM_OF_KEY_CANDIDATE; i++) {
  P = key_candidate[i];
  evaluation = 0;
  prev_pattern_bit = (P & 1 );/* LSB is the previous pattern of MSB */
  for(j=SYMBOL_BITS-1; j>=0;j--) {
     pattern_bit = (P & (1<<j))>>j;
     if (pattern_bit == prev_pattern_bit) {
        evaluation += symbol_statistics[j];
     } else {
        evaluation -= symbol_statistics[j];
     }
     prev_pattern_bit = pattern_bit;
   }
}
```

FIG. 10

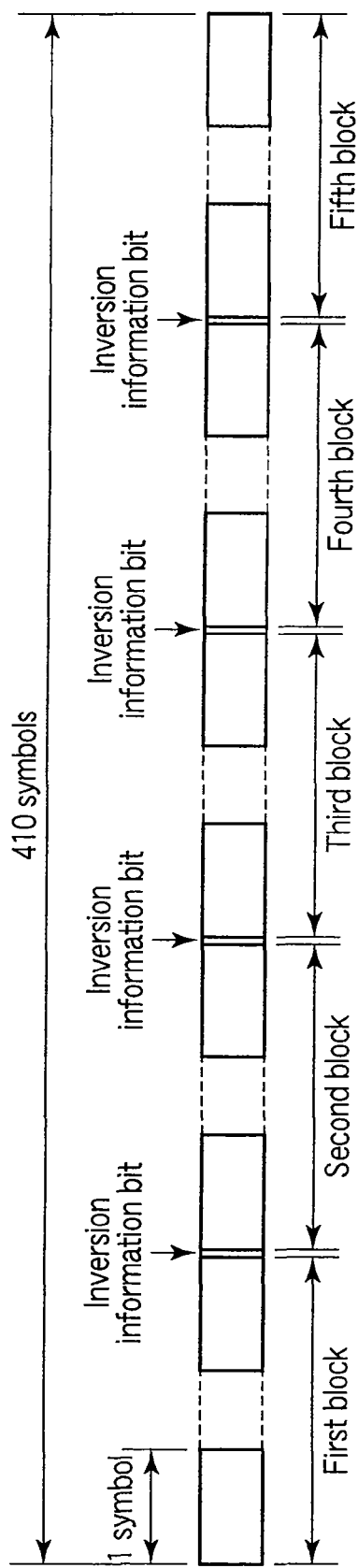
F I G. 11

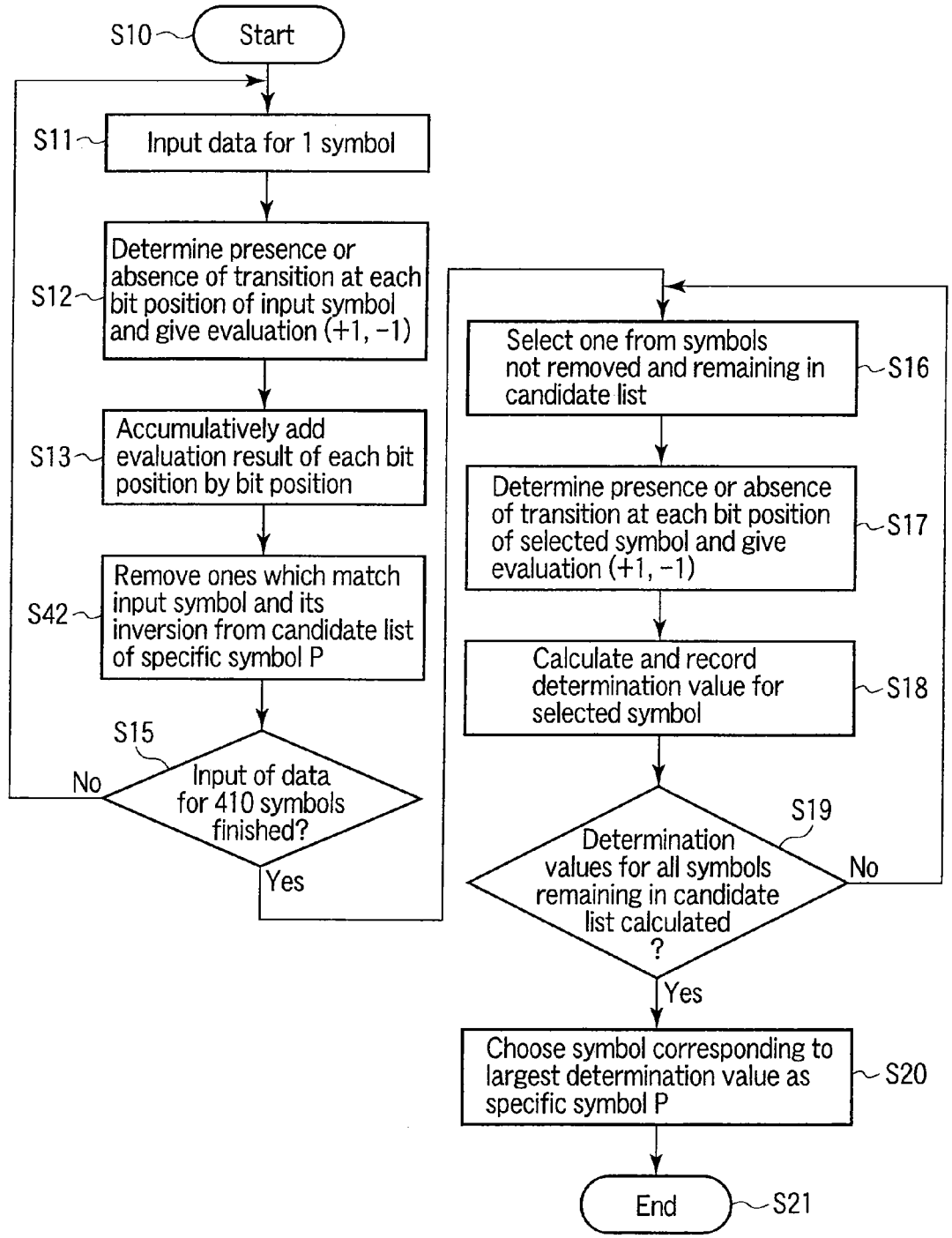
F I G. 15

RUN LENGTH LIMITER AND RUN LENGTH LIMITING METHOD

CROSS-REFERENCE TO RELATED APPLICATIONS

This application is based upon and claims the benefit of priority from Japanese Patent Application No. 2008-316065, filed Dec. 11, 2008, the entire contents of which are incorporated herein by reference.

BACKGROUND

1. Field

One embodiment of the invention relates to a run length limiter and a run length limiting method for applying run limiting processing to a digital data string to be recorded on an information recording medium.

2. Description of the Related Art

As is well known, when a digital data string is recorded on an information recording medium such as a hard disk or an optical disk, run length limiting processing is applied to the digital data string to be recorded so as to prevent the digital data string from containing consecutive "0"s. Among current ones of run length limiting processing means, however, one having a high coding rate has a large operation amount, resulting in having a large circuit size.

Jpn. Pat. Appln. KOKAI Publication No. 2002-141804 discloses a code converter for converting m data bits to n channel bits (m<n). In the code converter, when selecting an optimal piece in the case where a plurality pieces of n-bit candidate data exist, an absolute value of a DSV (digital sum variation) is minimized within a range satisfying a minimum inversion interval continuation limiting rule.

BRIEF DESCRIPTION OF THE SEVERAL VIEWS OF THE DRAWINGS

A general architecture that implements the various feature of the invention will now be described with reference to the drawings. The drawings and the associated descriptions are provided to illustrate embodiments of the invention and not to limit the scope of the invention.

FIG. 1 is a block diagram for explaining the outline of an HDD according to an embodiment of the invention;

FIG. 2 is a view for explaining a basic first method of run length limiting processing performed by a modulation processing module of the HDD in the embodiment;

FIG. 4 is a flowchart for explaining processing actions of the basic first method of the run length limiting processing in the embodiment;

FIG. 6 is a view for explaining another part of the method of searching for the specific symbol for use in the run length limiting processing in the embodiment;

FIG. 7 is a view for explaining the remaining part of the method of searching for the specific symbol for use in the run length limiting processing in the embodiment;

FIG. 9 is a view for explaining part of algorithm for searching for the specific symbol for use in the run length limiting processing in the embodiment;

FIG. 10 is a view for explaining the remaining part of the algorithm for searching for the specific symbol for use in the run length limiting processing in the embodiment;

FIG. 11 is a view for explaining a basic second method of the run length limiting processing performed by the modulation processing module of the HDD in the embodiment;

FIG. 15 is a flowchart for explaining another example of processing actions of searching for the specific symbol for use in the run length limiting processing in the embodiment.

DETAILED DESCRIPTION

Figure 3:
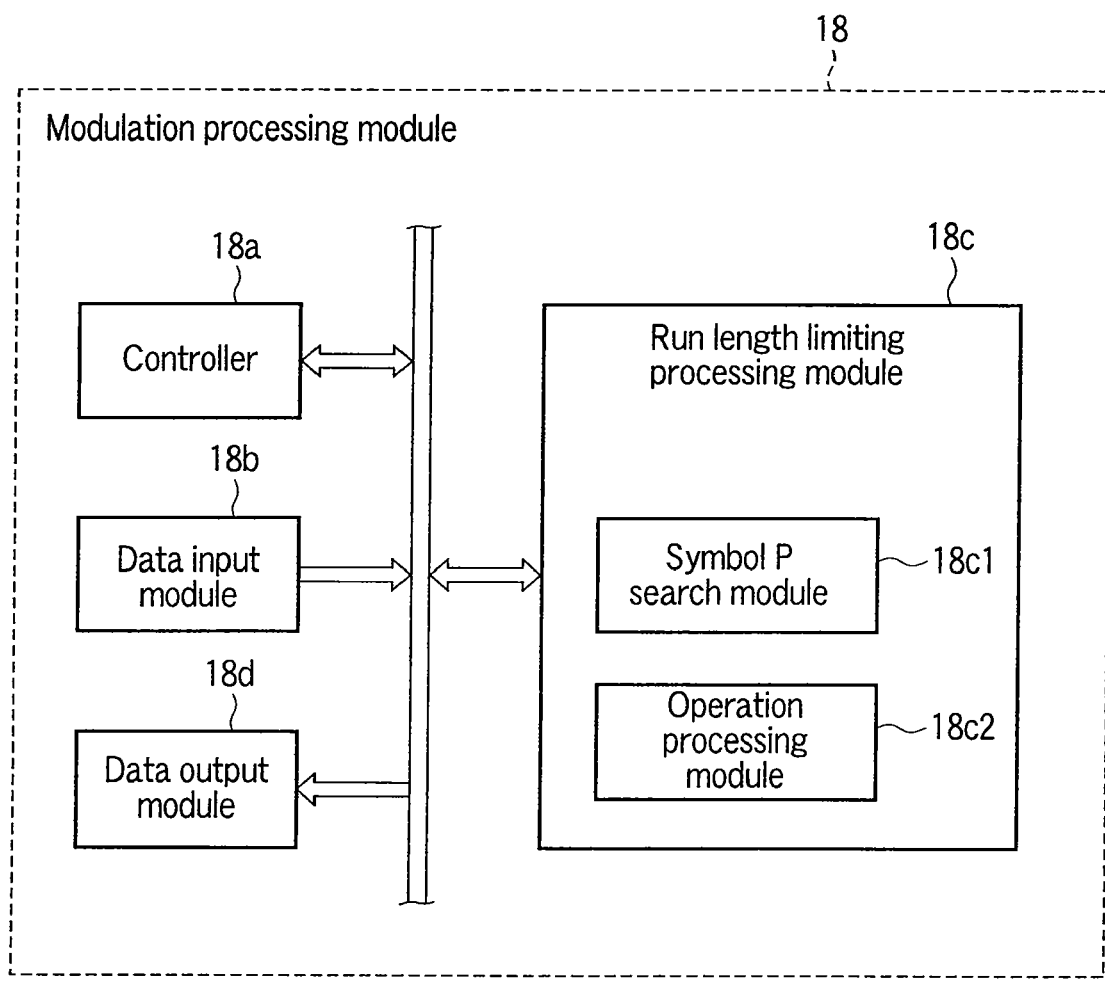
FIG. 3 is a block diagram for explaining an example of the modulation processing module of the HDD in the embodiment.

Various embodiments according to the invention will be described hereinafter with reference to the accompanying drawings. In general, according to one embodiment of the invention, a run length limiter includes a searcher configured to search a received digital data for a specific symbol, an operator configured to operate an exclusive OR operation of the specific symbol and the digital data, and an output module configured to output the exclusive OR operated digital data with the specific symbol.

FIG. 1 shows the outline of an HDD (hard disk drive) 11, which is an information recording and reproducing apparatus to be described in this embodiment. The HDD 11 includes a signal processing module 12 implemented in an IC (integrated circuit), and a driving module 14 which rotationally drives a hard disk 13, and writes a digital data string supplied from the signal processing module 12 to the hard disk 13 and reads a digital data string from the hard disk 13 and supplies it to the signal processing module 12.

Here, the above signal processing module 12 has a host I/F (interface) 16 for giving information to and receiving it from an external host device 15. The host device 15 is assumed to be, for example, a PC (personal computer). For example, upon executing predetermined application software, the host device 15 writes and reads information using the HDD 11, and also can use the HDD 11 as a unit in which information finally obtained is stored.

In this case, the host device 15 generates commands which request the HDD 11 to write information and read information. These commands are supplied through the host I/F 16 to a main control module 17 and then analyzed in the main control module 17. The main control module 17 has a CPU (central processing unit) incorporated therein, and centrally controls various actions performed by the HDD 11.

For example, when a writing request command is supplied from the host device 15, the writing request command is supplied through the host I/F 16 to the main control module 17 and then analyzed in the main control module 17. Therefore, the main control module 17 individually drives a modulation processing module 18 and a coding processing module 19, and also controls, through a disk I/F 20, the driving module 14 to be in a state of writing a digital data string to the hard disk 13.

A digital data string to be written is supplied through the host I/F 16 to the modulation processing module 18. The modulation processing module 18 applies run length limiting processing (e.g., processing of preventing consecutive "0"s from exceeding a fixed length) in a form meeting requirements of a recording and reproducing system in the HDD 11, such as run length coding processing, to the input digital data string.

The digital data string to which the run length limiting processing has been applied in the modulation processing module 18 is supplied to the coding processing module 19. The coding processing module 19 calculates, for example, ECC (error correcting code) parity, which is an error correction code based on an RS (read solomon) code, and adds the ECC parity to the input digital data string.

The digital data string to which the ECC parity has been added by the coding processing module 19 is supplied through the disk I/F 20 to the driving module 14, so that it is written to the hard disk 13. Thus, writing processing of the digital data string to the hard disk 13 based on the writing request from the host device 15 is performed.

When a reading request command is supplied from the host device 15, the reading request command is supplied through the host I/F 16 to the main control module 17 and analyzed in the main control module 17. Therefore, the main control module 17 individually drives a decoding processing module 21 and a demodulation processing module 22, and also controls, through the disk I/F 20, the driving module 14 to be in a state of reading a digital data string from the hard disk 13.

A digital data string (including ECC parity) read from the hard disk 13 is supplied through the disk I/F 20 to the decoding processing module 21. The decoding processing module 21 applies error correction processing based on the ECC parity to the input digital data string.

The digital data string to which error correction processing has been applied by the decoding processing module 21 is supplied to the demodulation processing module 22. The demodulation processing module 22 demodulates the run length limiting processing, such as run length coding processing, applied to the input digital data string to restore the digital data string to its original state.

The digital data string to which demodulating processing has been applied by the demodulation processing module 22 is output through the host I/F 16 to the host device 15. Thus, reading processing of the digital data string from the hard disk 13 based on the reading request from the host device 15 is performed.

Here, description is given to a basic first method of the run length limiting processing performed by the modulation processing module 18. That is, assume that 512-byte user data is a digital data string to be input to the modulation processing module 18. In this case, the digital data string to be input is 4096 bits since 1 byte is 8 bits. Provided that 10 bits is 1 symbol, the digital data string is represented as 410 symbols as shown in FIG. 2.

The number of patterns which can be created for a 10-bit symbol is $2^{10}=1024$. Therefore, from 1024 kinds of patterns, the modulation processing module 18 searches for a specific symbol P having a pattern which does not match any one of 410 input symbols. In the modulation processing module 18, an exclusive OR operation is performed between the specific symbol P obtained by the search and each of 410 symbols, and the operation result is output together with the specific symbol P.

That is, using the specific symbol P having a pattern which does not match any one of 410 input symbols, an exclusive OR operation between the specific symbol P and each of 410 input symbols is performed. Thus, each of 410 symbols after the operation necessarily includes at least one "1".

In this case, as shown in FIG. 2, the number of consecutive "0"s is the largest when only the head bit in the initial symbol of two consecutive symbols is "1" and only the final bit in the next symbol is "1", resulting in the number of consecutive "0"s of 18. With this basic method of run length limiting processing, assuming that the number of bits of one symbol is n, the run length can be limited to a maximum of 2n−2.

In this way, the specific symbol P having a pattern which does not match any one of input symbols is searched for, and using the specific symbol P obtained by the search, an exclusive OR operation between each input symbol and the specific symbol P is performed. This enables the run length limiting processing, which reduces the number of consecutive "0"s to a maximum of 18, to be performed easily with a simple structure. The number of output bits is 4106, which is obtained by adding 10 bits of the symbol P to 4096 bits of the input digital data string. The coding rate is very high, 4096/4106=0.99756. The method is thus suitable to practical use.

FIG. 3 shows an example of the modulation processing module 18. That is, the modulation processing module 18 can give data to and receive it from the main control module 17, and includes a controller 18*a* for centrally controlling various actions performed by the modulation processing module 18 based on control from the main control module 17.

The modulation processing module 18 also includes a data input module 18*b* which inputs a digital data string supplied from the host device 15 to be written to the hard disk 13, a run length limiting processing module 18*c* which applies run length limiting processing to the digital data string input to the data input module 18*b*, a data output module 18*d* which outputs, to the coding processing module 19, the digital data string which has been subjected to the run length limiting processing in the run length limiting processing module 18*c*, and the like.

The run length limiting processing module 18*c* includes a symbol P search module 18*c*1 for searching for the specific symbol P, an operation processing module 18*c*2 for performing various kinds of operation processing, determination processing, and the like.

FIG. 4 is a flowchart in which processing actions of the above-described basic first method of run length limiting processing in the modulation processing module 18 are summarized. The processing actions are started (step S1) when a digital data string including 410 symbols to be written has been accumulated in the host I/F 16.

Then, in step S2, the controller 18*a* causes the data input module 18*b* to input data for one symbol (10 bits) from the host I/F 16. In step S3, the controller 18*a* causes the symbol P search module 18*c*1 to remove symbols each having a pattern which matches the input symbol from a candidate list (including 1024 patterns which can be created for 10-bit data) prepared in advance for searching for the specific symbol P. Note that at least [the number of bits of all the data (4096)/(the number of bits of one symbol)n] (rounding upwards if indivisible) symbols are required for the candidate list.

In step S4, the controller 18*a* determines whether input of data for all 410 symbols is finished. If it is determined that the data input is not finished (NO), the controller 18*a* is returned to step S2.

Alternatively, if it is determined that the input of data for all 410 symbols is finished (YES) in step S4, the controller 18*a* causes the symbol P search module 18*c*1 to select one symbol from a plurality of symbols which are not removed and remain in the candidate list and output the selected symbol as the specific symbol P in step S5.

Then, in step S6, the controller 18a causes the data input module 18b to input data for one symbol again from the host I/F 16. In step S7, the controller 18a causes the operation processing module 18c2 to perform an exclusive OR operation between the input symbol and the selected specific symbol P.

In step S8, the controller 18a determines whether input of data for all 410 symbols is finished. If it is determined that the data input is not finished (NO), the controller 18a is returned to step S6.

Alternatively, if it is determined that the input of data for all 410 symbols is finished (YES) in step S8, the controller 18a causes the data output module 18d to output each symbol after the exclusive OR operation together with the specific symbol P to the coding processing module 19, and the process ends (step S9).

Here, in the above-described, basic first method of the run length limiting processing, the specific symbol P having a pattern which does not match any one of 410 input symbols is searched for, and using the specific symbol P obtained by the search, an exclusive OR operation between the specific symbol P and each input symbol is performed, thereby limiting the run length.

On the other hand, it is known that in a magnetic recording medium like the above-mentioned hard disk 13, when there are fewer transitions in a digital data string to be written, that is, the number of times the logical value is inverted, such as "0"→"1" and "1"→"0", is fewer, the probability of occurrence of an error is lower upon writing and reading of the digital data string.

Accordingly, in this embodiment, when searching for the specific symbol P from a plurality of symbols which do not match the input symbols and remain in the candidate list, the specific symbol P which minimizes transitions in a digital data string after exclusive OR operations is searched for. This is intended to minimize transitions in a digital data string after run length limiting processing as well as to achieve the above-described run length limiting effect.

A method to search for, in the candidate list, the specific symbol P which minimizes transitions in a digital data string after run length limiting processing will be described below. First, the presence or absence of occurrence of a transition at each bit position is determined for each of 410 input symbols.

This determination is as follows. For example, assuming that each symbol is recorded on the hard disk 13 in the order from its MSB (most significant bit) to its LSB (least significant bit), if the logical value of a predetermined bit of one symbol is equal to the logical value of the bit adjoining the MSB side of the predetermined bit, the absence of a transition is determined for the predetermined bit. Alternatively, the logical value of a predetermined bit of one symbol is different from the logical value of the bit adjoining the MSB side of the predetermined bit, the presence of a transition is determined for the predetermined bit.

In this case, for the head bit (MSB) of a symbol positioned at the head of 410 symbols, the presence or absence of a transition is determined by comparing the logical value of the head bit with a logical value (e.g., "0") set in advance. For the head bit (MSB) positioned at the head of each of symbols other than the head symbol, the presence or absence of a transition is determined by comparing the logical value of the head bit with the logical value of the final bit (LSB) of a symbol immediately before the symbol of the head bit.

When the presence or absence of a transition has been determined for each of 410 input symbols in such a way as mentioned above, determination results for all symbols at the same bit position are combined, so that the tendency of a small number of transitions or a large number of transitions is evaluated at each bit position.

Next, all the symbols which do not match the input symbols and remain are selected from the candidate list, and the presence or absence of occurrence of a transition at each bit position is determined for each of the selected symbols in the same way as mentioned above. In this case, for the bit (MSB) positioned at the head of the symbol, the presence or absence of a transition is determined by comparing the logical value of the head bit with the logical value of the final bit (LSB) of the symbol.

Then, for each of the symbols selected from the candidate list, the transition evaluation result at each bit position obtained from 410 input symbols is compared with a transition determination result at the same bit position as that of the transition evaluation result. Among the symbols selected from the candidate list, selected as the specific symbol P which minimizes transitions in a digital data string after run length limiting processing is a symbol having the largest number of states in which the transition determination result indicates the presence of a transition at the bit position corresponding to the bit position at which a large number of transitions are indicated by the transition evaluation result, and the transition determination result indicates the absence of a transition at the bit position corresponding to the bit position at which a small number of transitions are indicated by the transition evaluation result.

Figure 5:
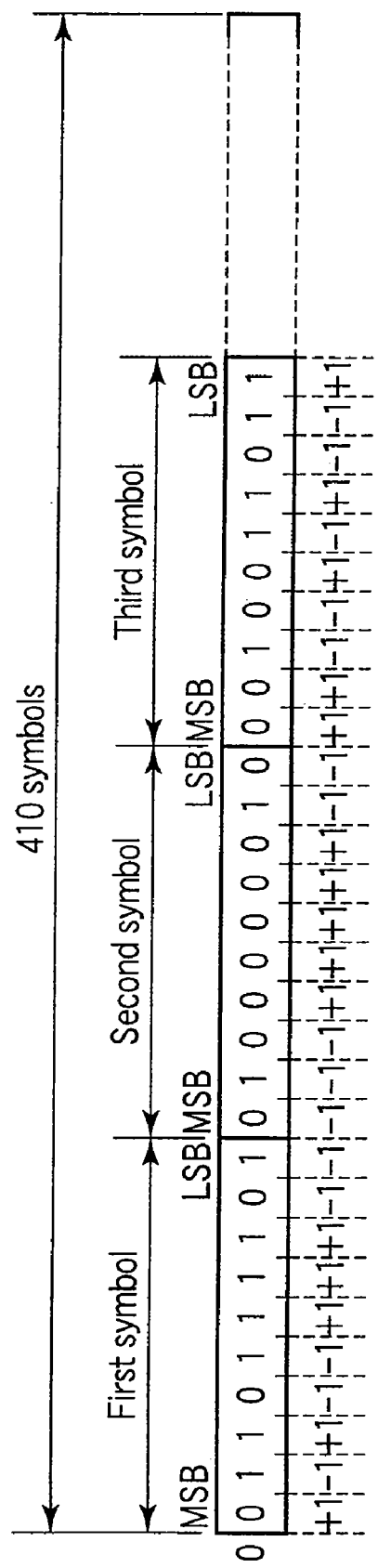
FIG. 5 is a view for explaining part of a method of searching for a specific symbol for use in the run length limiting processing in the embodiment.

The above method of searching for the specific symbol P will be concretely described. That is, as a digital data string input to the modulation processing module 18, 410 symbols each including 10 bits are assumed as shown in FIG. 5. In this case, assuming that among 410 symbols, a first symbol, or the head symbol, is "0110111101", the subsequent second symbol is "0100000010", and the subsequent third symbol is "0010011011", a concrete example is described. For symbols other than those, processing is performed in the same way as the first to third symbols.

First, for each of the first to third symbols, the presence or absence of occurrence of a transition at each bit position is determined. Assume that for the head bit (MSB) of the first symbol, the immediately preceding logical value is "0". In the actual hard disk 13, a specific pattern may be disposed at the head of a data sector. In this case, the final bit (LSB) of the specific pattern is assumed to be "0".

Accordingly, for the head bit (MSB) of the first symbol, its logical value "0" is equal to the immediately preceding logical value "0", and therefore it is determined that a transition is absent. An evaluation of +1 is given to the bit position for which the absence of a transition is determined. In contrast, for the bit next to the head bit (MSB) of the first symbol, its logical value "1" is different from the logical value "0" of the immediately preceding (MSB side) bit (head bit), and therefore it is determined that a transition is present. An evaluation of −1 is given to the bit position for which the presence of a transition is determined.

Hereinbelow, for each bit constituting the first to third symbols, an evaluation of +1 is given when the logical value of the bit is equal to that of the immediately preceding bit, whereas an evaluation of −1 is given when the logical value of the bit is different. Accordingly, for the first symbol, evaluations +1, −1, +1, −1, −1, +1, +1, +1, −1, −1 are given from the head bit (MSB) toward the final bit (LSB); for the second symbol, evaluations −1, −1, −1, +1, +1, +1, +1, +1, −1, −1 are given from the head bit (MSB) toward the final bit (LSB); and for the third symbol, evaluations +1, +1, −1, −1, +1, −1, +1, −1, −1, +1 are given from the head bit (MSB) toward the final bit (LSB). Likewise, for the fourth symbol and the subsequent symbols which are not shown and which follow the third symbol, evaluations are given at each bit position.

As mentioned above, when the presence or absence of a transition at each bit position has been determined for each of 410 input symbols, evaluation results for all the symbols at the same bit position are summed up, as shown in FIG. 6, so that the total evaluation for each bit position is calculated.

In an example shown in FIG. 6, the total evaluations of transitions are +10, −5, +13, −1, +6, +20, −10, −5, +2, +15 from the head bit (MSB) toward the final bit (LSB). The total evaluations indicate that the larger the positive (plus) value of a bit position, the smaller the number of transitions at the bit position, whereas the larger the negative (minus) value of a bit position, the larger the number of transitions.

Here, the specific symbol P, which is used for an exclusive OR operation between the specific symbol P and each of 410 input symbols, is considered. Regarding a bit position at which a large number of transitions tend to occur, it is advantageous for the specific symbol P that a transition occurs at that bit position of the input symbol. For example, in the case of a portion "01" of the input symbol, if an exclusive OR operation between "01" and "10" or "01" is performed, the operation result is "11" or "00", respectively. No transition occurs.

Regarding a bit position at which a small number of transitions tend to occur, it is advantageous for the specific symbol P that no transition occurs at that bit position of the input symbol. For example, in the case of a portion "00" of the input symbol, if an exclusive OR operation between "00" and "00" or "11" is performed, the operation result is "00" or "11", respectively. No transition occurs.

In view of the above, description is given to a method of selecting the specific symbol P which minimizes transitions in a digital data string after run length limiting processing from a plurality of symbols which do not match the input symbols and remain in the candidate list, based on the transition tendency at each bit position obtained from 410 input symbols.

That is, as indicated by a mark (a) in FIG. 7, the total evaluation of transitions at each bit position is calculated from 410 input symbols. Next, as indicated by a mark (b) in FIG. 7, one of a plurality of symbols which do not match the 410 input symbols and remain is selected from the candidate list. For the selected symbol, the presence or absence of occurrence of a transition at each bit position is determined in the same way as mentioned above. In this case, for the bit (MSB) positioned at the head of the symbol, by comparing its logical value with the logical value of the final bit (LSB) of that symbol, the presence or absence of a transition is determined.

Now, if the selected symbol is "0101101100", for the head bit (MSB) of the symbol, its logical value "0" is equal to the logical value "0" of the final bit (LSB), and therefore it is determined that a transition is absent. An evaluation of + is given to the bit position for which the absence of a transition is determined. In contrast, for the bit next to the head bit (MSB) of the symbol, its logical value "1" is different from the logical value "0" of the immediately preceding (MSB side) bit (head bit), and therefore it is determined that a transition is present. An evaluation of − is given to the bit position for which the presence of a transition is determined. As a result, for the selected symbol, evaluations of +, −, −, −, +, −, −, +, −, + are given from the head bit (MSB) toward the final bit (LSB).

Then, the total evaluation result of the transition calculated from 410 input symbols at each bit position is compared with a determination result of the transition of the symbol selected from the candidate list at the same bit position as the position of the total evaluation result.

In this case, in the symbol selected from the candidate list, if the transition total evaluation result corresponding to a bit position with a transition determination result of + is +, or if the transition total evaluation result corresponding to a bit position with a transition determination result of − is −, the sign of the transition total evaluation result at the bit position is set to + as indicated by a mark (c) in FIG. 7. In an example indicated by the mark (c) in FIG. 7, the MSB, the second bit, the fourth bit, the fifth bit and the seventh bit in the order from the MSB, and the LSB are included in such a case.

In contrast, in the symbol selected from the candidate list, if the transition total evaluation result corresponding to a bit position with a transition determination result of + is −, or if the transition total evaluation result corresponding to a bit position with a transition determination result of − is +, the sign of the transition total evaluation result at the bit position is set to − as indicated by the mark (c) in FIG. 7. In the example indicated by the mark (c) in FIG. 7, the third bit, the sixth bit, the eighth bit and the ninth bit in the order from the MSB are included in such a case.

Then, the transition total evaluation results for 10 bits for which the sign + or − is changed based on the transition determination result of the symbol selected from the candidate list are summed up. The resultant value is a determination value for searching for the specific symbol P. In the example indicated by the mark (c) in FIG. 7, the transition total evaluation results from the head bit (MSB) toward the final bit (LSB) are +10, +5, −13, +1, +6, −20, +10, −5, −2, +15, and the determination value is +7.

Subsequently, from the candidate list, for all symbols which do not match 410 input symbols and remain, transition determination at each bit position is performed to calculate the determination value in the same way as mentioned above. A symbol which obtains the largest determination value is selected, among all the symbols which do not match the input symbol and remain in the candidate list, as the specific symbol P having the highest tendency of a state where a transition occurs at a bit position corresponding to the bit position at which a large number of transitions tend to occur in the input symbols whereas no transition occurs at a bit position corresponding to the bit position at which a small number of transitions tend to occur in the input symbols, that is, the specific symbol P which minimizes transitions in a digital data string after run length limiting processing.

Figure 8:
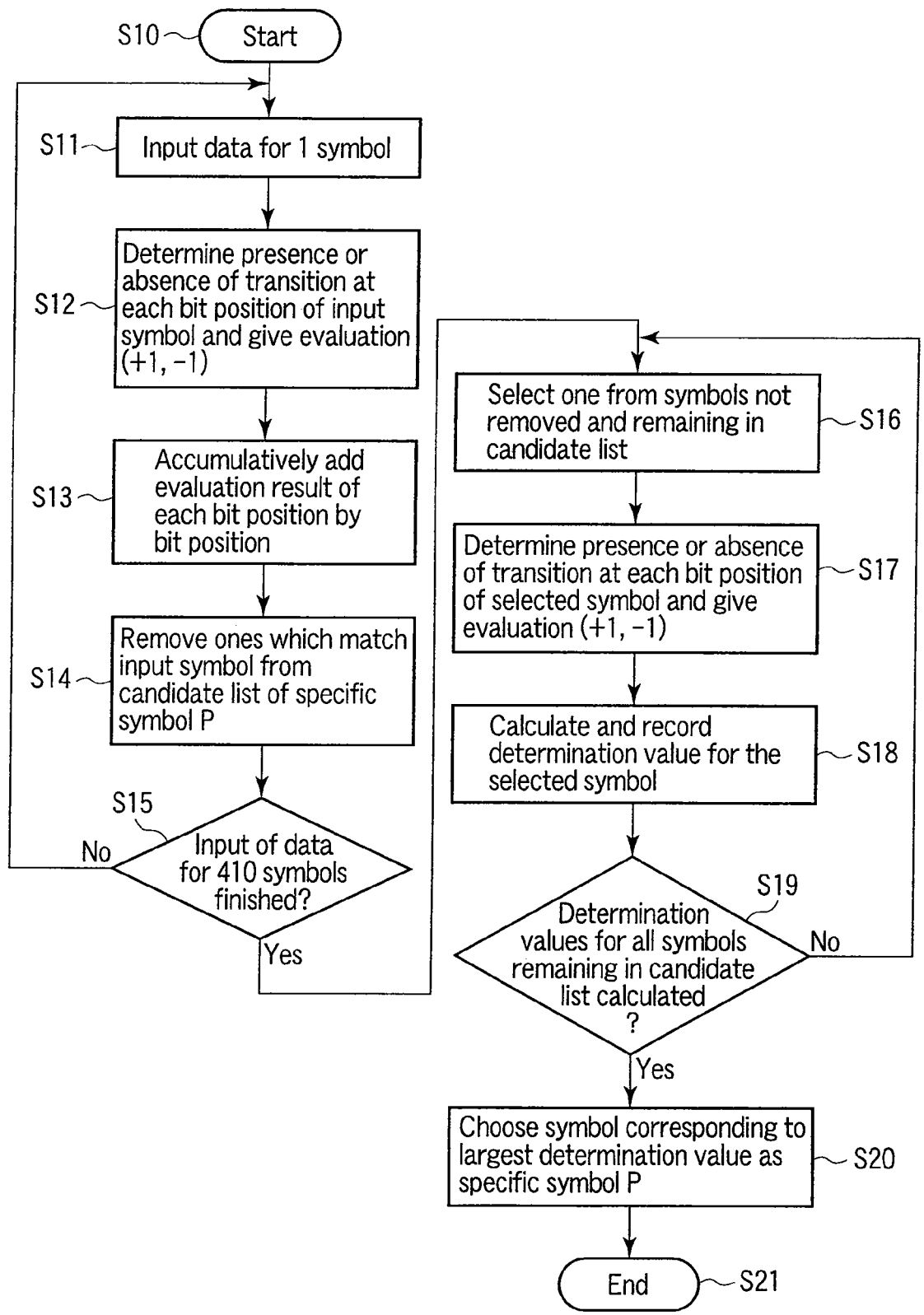
FIG. 8 is a flowchart for explaining processing actions of searching for the specific symbol for use in the run length limiting processing in the embodiment.

FIG. 8 is a flowchart in which processing actions of searching for the specific symbol P from all symbols which do not match the input symbols and remain in the candidate list are summarized. The processing actions are started (step S10) when a digital data string including 410 symbols to be written has been accumulated in the host I/F 16.

Then, in step S11, the controller 18a causes the data input module 18b to input data for one symbol (10 bits) from the host I/F 16. In step S12, the controller 18a causes the symbol P search module 18c1 to determine the presence or absence of a transition at each bit position of the input symbol and give an evaluation of +1 to a bit position without a transition and an evaluation of −1 to a bit position with a transition. Then, in step S13, the symbol P search module 18c1 accumulatively adds the evaluation result given to each bit position of the input symbol, by bit position.

Then, in step S14, the controller 18a causes the symbol P search module 18c1 to remove symbols each having a pattern which matches the input symbol from a candidate list (including 1024 patterns which can be created for 10-bit data) prepared in advance for searching for the specific symbol P.

In step S15, the controller 18a determines whether data input of all 410 symbols is finished. If it is determined that the data input is not finished (NO), the controller 18a is returned to step S11, and the input of data for the next one symbol is performed.

Alternatively, if it is determined that the data input of all 410 symbols is finished (YES) in step S15, the controller 18a causes the symbol P search module 18c1 to select one symbol from a plurality of symbols which are not removed and remain in the candidate list in step S16, and to determine the presence or absence of the transition at each bit position for the selected symbol and give an evaluation of + to a bit position without a transition and an evaluation of − to a bit position with a transition in step S17.

Then, in step S18, the controller 18a causes the symbol P search module 18c1 to change the positive or negative sign of the accumulative addition value of evaluation results for each bit position obtained from all input symbols, based on the evaluation result at each bit position of the symbol selected from the candidate list, and sum up the accumulative addition values at all bit positions, so that a determination value for the selected symbol is calculated and recorded.

In step S19, the controller 18a causes the symbol P search module 18c1 to determine whether calculation of determination values of all symbols which are not removed and remain in the candidate list is finished. If it is determined that the calculation is not finished (NO), the controller 18a is returned to step S16, and the next symbol is selected from the candidate list.

Alternatively, if it is determined that the calculation is finished (YES) in step S19, the controller 18a causes the symbol P search module 18c1 to select the largest one of determination values calculated for all symbols remaining in the candidate list and choose a symbol corresponding to the selected determination value as the specific symbol P for performing an exclusive OR operation between the specific symbol P and the input symbol in step S20, and the process ends (step S21).

Here, FIG. 9 shows an example of algorithm for processing to determine the presence or absence of a transition at each bit position for an input symbol, to give an evaluation of +1 to a bit position without a transition and an evaluation of −1 to a bit position with a transition, and to accumulatively add the evaluation result given to each bit position of the input symbol by bit position, that is, processing in steps S11 to S13 in FIG. 8.

FIG. 10 shows an example of algorithm for processing to calculate determination values for all symbols remaining in the candidate list and to select a symbol corresponding to the largest one of the calculated determination values as the specific symbol P, that is, processing in steps S16 to S20 in FIG. 8.

Next, description is given to a basic second method of run length limiting processing performed by the above-mentioned modulation processing module 18. In the second method, the run length is limited to a maximum of 2n−1 bit, and the occurrence frequencies of "0" and "1" are more balanced than the example of the first method.

That is, also in this second method, assuming that 512-byte user data is a digital data string to be input to the modulation processing module 18, that digital data string is 4096 bits since 1 byte is 8 bits. Provided that 10 bits is 1 symbol, the digital data string is represented as 410 symbols as shown in FIG. 11.

The number of patterns which can be created for a 10-bit symbol is $2^{10}=1024$. Therefore, from 1024 patterns, the modulation processing module 18 searches for the 10-bit specific symbol P having a pattern which does not match any one of 410 input symbols and any inverted one of 410 input symbols.

Then, in the modulation processing module 18, as shown in FIG. 11, 410 symbols are uniformly divided into a plurality of (five in the case shown in the figure) blocks. In this case, one block is 82 symbols. In each of boundary portions (four portions) of each block, a inversion information bit of one bit is interposed.

Here, for the second to fifth blocks other than the head, first block, from a result of an exclusive OR operation between each of 82 symbols and the specific symbol P and a result of an exclusive OR operation between a converted one of each of 82 symbols and the specific symbol P, the modulation processing module 18 selects one in which occurrence frequencies of "0" and "1" are more balanced, and outputs the selected one.

In the blocks for which the result of an exclusive OR operation between each of 82 symbols and the specific symbol P has been output, the inversion information bit at the head is set to "0", whereas in the blocks for which the result of an exclusive OR operation between a converted one of each of 82 symbols and the specific symbol P has been output, the inversion information bit at the head is set to "1".

That is, in the second method, the 10-bit specific symbol P having a pattern which does not match any one of 410 input symbols and any inverted one of 410 input symbols is searched for, and in each block, from a result of an exclusive OR operation between each symbol constituting the block and the specific symbol P and a result of an exclusive OR operation between a converted one of each symbol constituting the block and the specific symbol P, one in which occurrence frequencies of "0" and "1" are more balanced is selected and output.

This enables the run length limiting processing in which occurrence frequencies of "0" and "1" are more balanced than in the first method to be performed easily with a simple structure. The number of output bits is 4110, which is obtained by adding 10 bits of the specific symbol P and 4 bits of the inversion information bit to 4096 bits of the input digital data string. The coding rate is very high, 4096/4110=0.99659. The method is suitable to practical use.

In this second method, the number of consecutive "0"s is the largest when only the head bit in the final symbol of the initial block of two consecutive blocks is "1" and only the final bit in the head symbol of the next block is "1", and an inversion information bit interposed between both blocks is "0", resulting in the number of consecutive "0"s of 19. In other words, assuming that the number of bits of one symbol is n, the run length can be limited to a maximum of 2n−1.

Note that in the second method, a symbol which does not match any one of 410 input symbols and any inverted one of 410 input symbols is selected as the specific symbol P for the purpose of preventing all results of exclusive OR operations each performed between the inverted one of each symbol and the specific symbol P from being "0". Also in the second method, the number and position of inversion information bits interpolated may be appropriately set.

Figure 12:
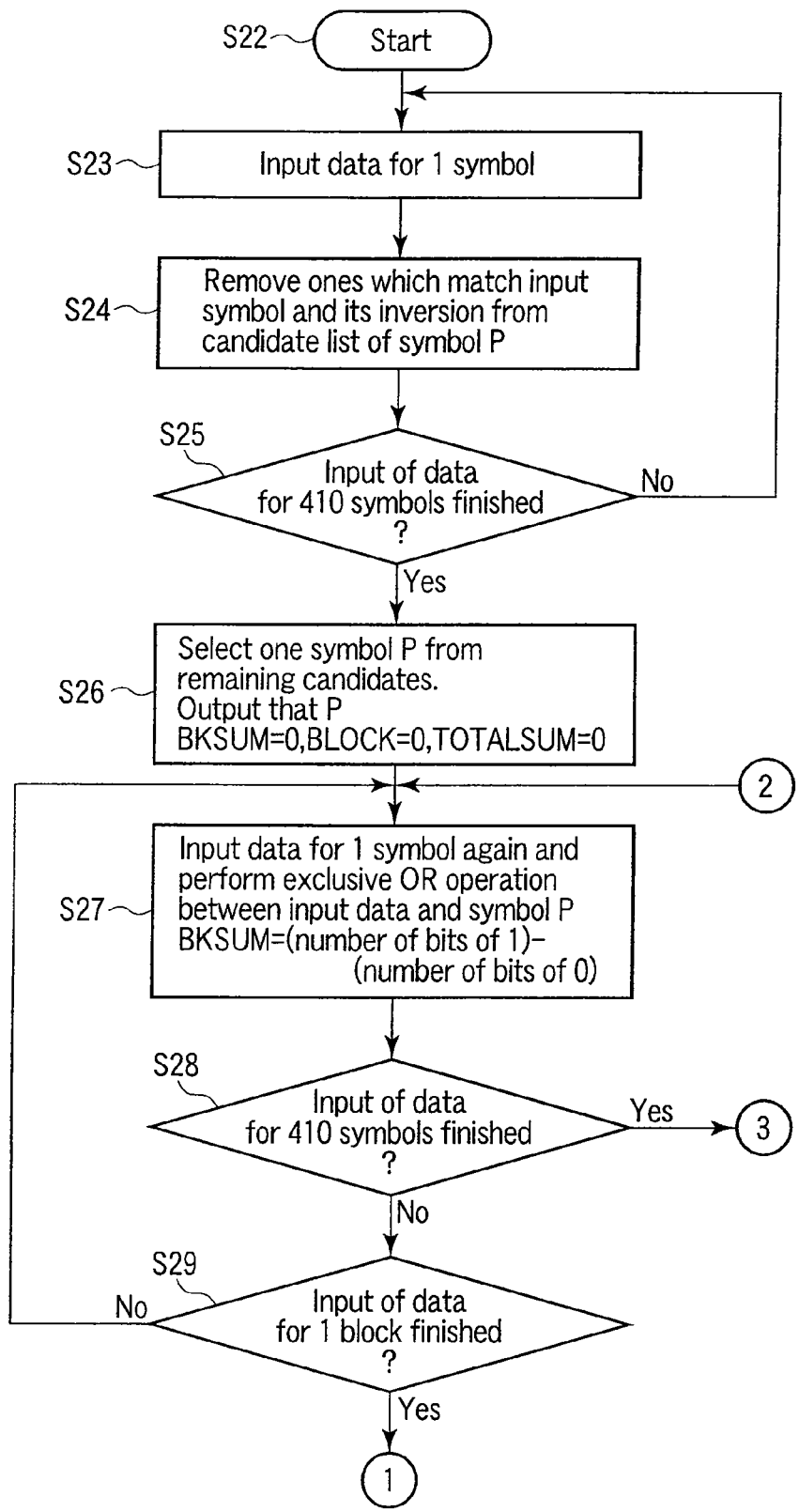
FIG. 12 is a flowchart for explaining part of processing actions of the basic second method of the run length limiting processing in the embodiment.
Figure 13:
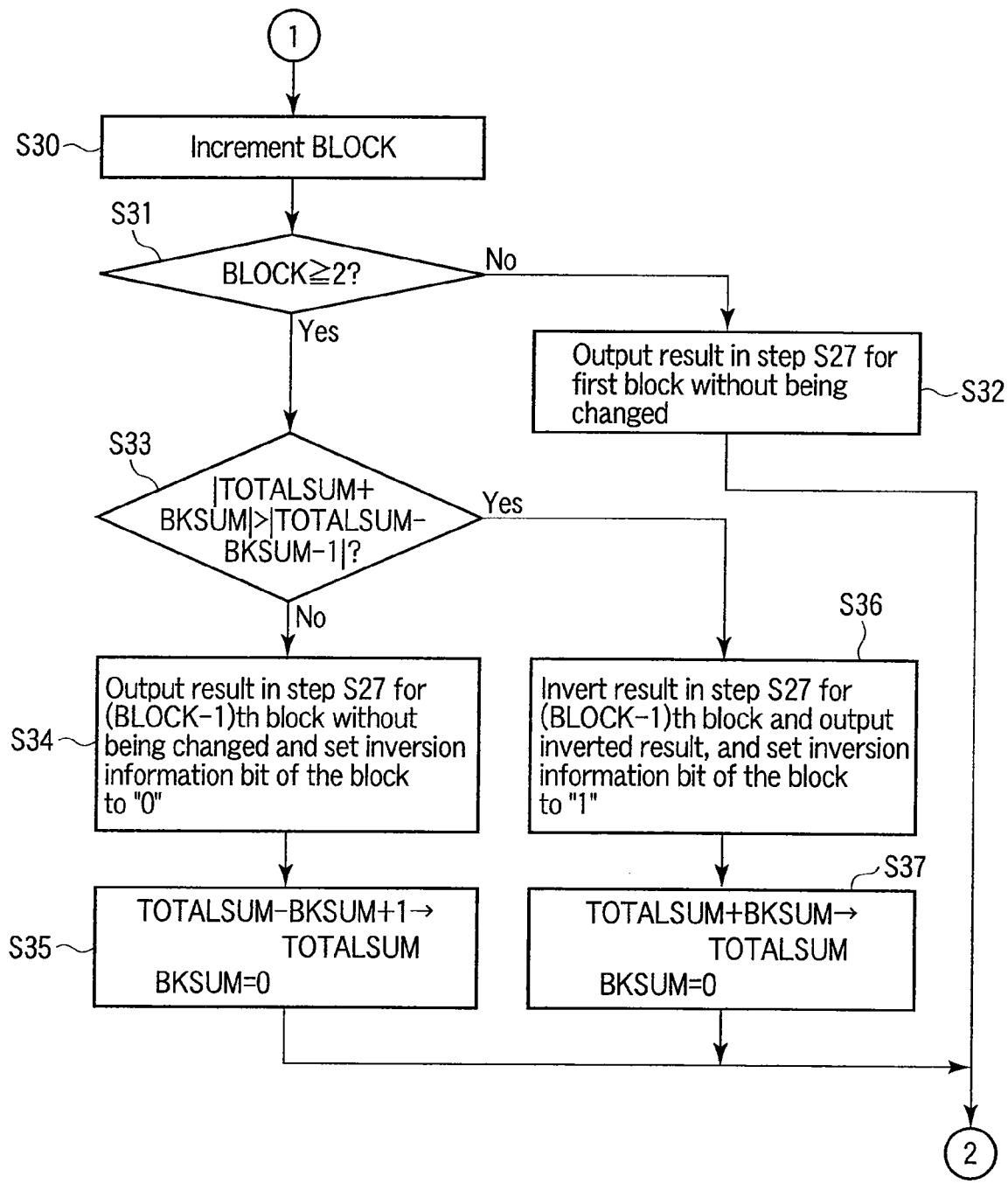
FIG. 13 is a flowchart for explaining another part of processing actions of the basic second method of the run length limiting processing in the embodiment.
Figure 14:
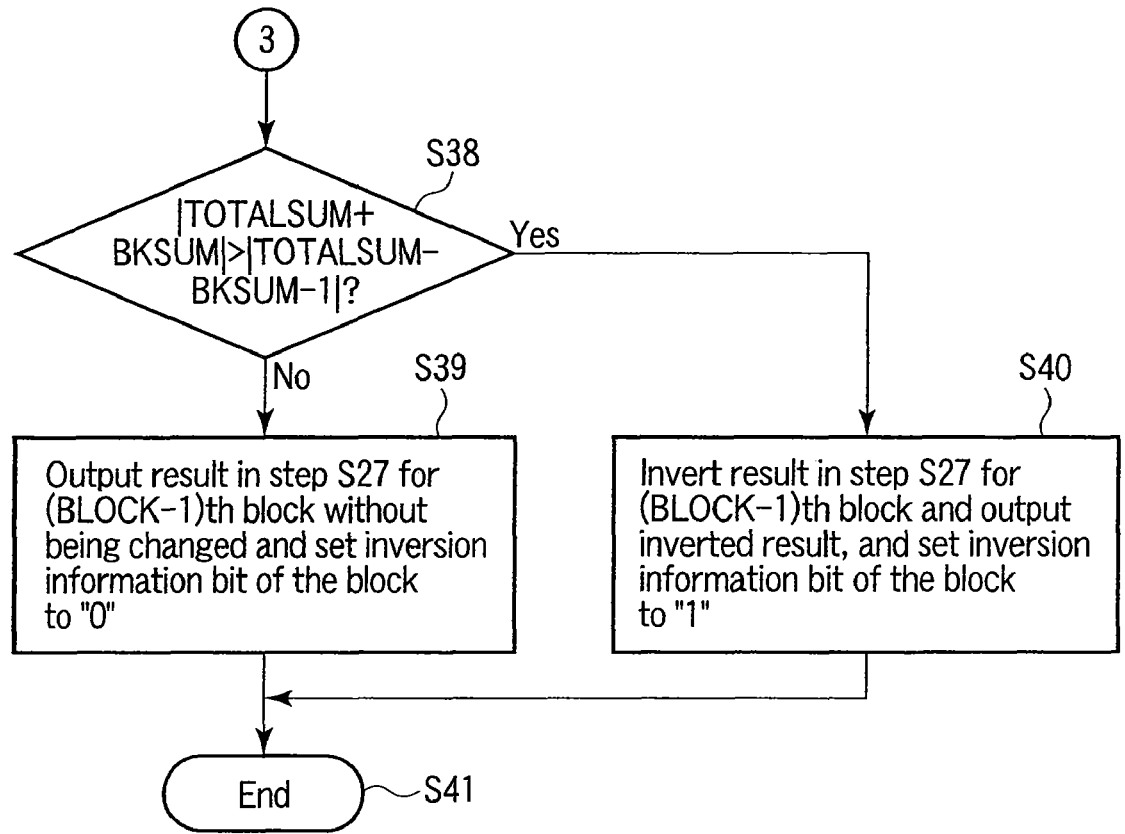
FIG. 14 is a flowchart for explaining the remaining part of processing actions of the basic second method of the run length limiting processing in the embodiment.

FIGS. 12 to 14 are flowcharts in which processing actions of the above-described basic second method of run length limiting processing in the modulation processing module 18 are summarized. The processing actions are started (step S22) when a digital data string including 410 symbols to be written has been accumulated in the host I/F 16.

Then, in step S23, the controller 18a causes the data input module 18b to input data for one symbol (10 bits) from the host I/F 16. In step S24, the controller 18a causes the symbol P search module 18c1 to remove symbols each having a pattern which matches the input symbol and symbols each having a pattern which matches the inverted one of the input symbol from a candidate list (including 1024 patterns which can be created for 10-bit data) prepared in advance for searching for the specific symbol P.

In step S25, the controller 18a determines whether input of data for 410 symbols is finished. If it is determined that the data input is not finished (NO), the controller 18a is returned to step S23.

Alternatively, if it is determined that the input of data for 410 symbols is finished (YES) in step S25, the controller 18a causes the symbol P search module 18c1 to select one symbol from a plurality of symbols which are not removed and remain in the candidate list and to output the selected symbol as the specific symbol P in step S26.

Then, in step S26, a difference BKSUM between the number of "1"s and the number of "0"s in one block is set to 0, a block number BLOCK is set to 0, and a difference TOTALSUM between the number of "1"s and the number of "0"s in all 410 symbols is initialized to 0.

Then, in step S27, the controller 18a causes the data input module 18b to input data for one symbol again from the host I/F 16, and the controller 18a causes the operation processing module 18c2 to perform an exclusive OR operation between the input symbol and the selected specific symbol P, and obtains BKSUM after the exclusive OR operation and adds it to the current BKSUM.

In step S28, the controller 18a determines whether input of data for 410 symbols is finished. If it is determined that the data input is not finished (NO), the controller 18a determines whether input of data for one block is finished in step S29. If it is determined that the data input is not finished (NO), the controller 18a is returned to step S27.

Alternatively, if it is determined that the input of data for one block is finished (YES) in step S29, the controller 18a increments the block number BLOCK in step S30 and determines whether the block number BLOCK is two or more in step S31.

Then, if it is determined that the block number BLOCK is not two or more (in this case, the block number BLOCK is 1, that is, the first block in FIG. 11) (NO), the controller 18a outputs the result obtained by the exclusive OR operation in step S27 for the first block without being changed in step S32, and then is returned to step S27. Thus, for the first block, results of exclusive OR operations each performed between each symbol of the block and the specific symbol P are output.

Alternatively, if it is determined that the block number BLOCK is two or more (that is, the second block and the subsequent blocks in FIG. 11) (YES) in step S31, the controller 18a determines whether the absolute value of (TOTALSUM+BKSUM) is larger than the absolute value of (TOTALSUM−BKSUM−1) in step S33. This represents whether the number of "0"s is larger than the number of "1"s from the first block to the current block for which an exclusive OR operation between each symbol and the specific symbol P has been finished.

If it is determined that the number of "1"s is larger (NO), the controller 18a outputs the result obtained by the exclusive OR operation in step S27 for the (BLOCK−1)th block without being changed and sets the head inversion information bit of the block to "0" in step S34.

Then, in step S35, the controller 18a subtracts a value obtained by adding one to BKSUM of the (BLOCK−1)th block from the current TOTALSUM, sets BKSUM to 0, and is returned to step S27.

If it is determined that the number of "0"s is larger (YES) in step S33, the controller 18a inverts the result obtained by the exclusive OR operation in step S27 for the (BLOCK−1)th block and outputs the inverted result (this output is the same as the above-mentioned result of the exclusive OR operation between the inverted symbol and the specific symbol P), and sets the head inversion information bit of the block to "1" in step S36.

Then, in step S37, the controller 18a adds BKSUM of the (BLOCK−1)th block to the current TOTALSUM, sets BKSUM to 0, and is returned to step S27.

Here, if it is determined that the input of data for 410 symbols is finished (YES) in step S28, the controller 18a determines whether the absolute value of (TOTALSUM+BKSUM) is larger than the absolute value of (TOTALSUM−BKSUM−1) in step S38. This represents whether the number of "0"s is larger than the number of "1"s in blocks from the first block to the final block for which an exclusive OR operation between each symbol and the specific symbol P has been finished.

If it is determined that the number of "1"s is larger (NO), the controller 18a outputs the result obtained by the exclusive OR operation in step S27 for the (BLOCK−1)th block (final block) without being changed and sets the head inversion information bit of the block to "0" in step S39, and then the process ends (step S41).

Alternatively, if it is determined that the number of "0"s is larger (YES) in step S38, the controller 18a inverts the result of the exclusive OR operation in step S27 for the (BLOCK−1)th block (final block) and outputs the inverted result (this output is the same as the above-mentioned result of the exclusive OR operation between the inverted symbol and the specific symbol P), and sets the head inversion information bit of the block to "1" in step S40. Then, the process ends (step S41).

In the processing actions of the second method shown in FIGS. 12 to 14, the candidate list of the symbol P in step S24 can be reduced by half in advance. This is because, since symbols each matching the pattern of an input symbol and symbols each matching the inverted one of the pattern are removed, for example, when "0011010110" is input, "1100101001" is simultaneously removed, and therefore it can be considered that one is removed from each of a set of 512 of which the most significant bit is "0" and a set of 512 of which the most significant bit is "1".

In other words, when only the set of which the most significant bit is "0" is used as candidates and the most significant bit of input data is "1", inverse patterns of the input data may be removed. It is found that information of nine bits is required for the pattern P in this way (the most significant bit can be fixed to "0"). As such, upon outputting the symbol P in step S26, the most significant bit need not be output, so that the number of output bits can be reduced by one.

Further, in the candidate list for the specific symbol P, patterns which are not suitable for recording, such as patterns where all bits are "1" or "0", may be removed from candidates in advance as far as the existence of one or more specific symbols P can be ensured.

Here, in the above-described, basic second method of the run length limiting processing, the specific symbol P having a pattern which match neither any one of 410 input symbols nor any inverted one of 410 input symbols is searched for, and using the specific symbol P obtained by the search, an exclusive OR operation between the specific symbol P and each input symbol is performed, thereby limiting the run length and balancing the occurrence frequencies of "0" and "1" more than in the first method.

Thus, when searching for the specific symbol P from a plurality of symbols which match neither input symbols nor the inverted ones of the input symbols and remain in the candidate list, the specific symbol P which minimizes transitions in a digital data string after exclusive OR operations is searched for. This makes it possible to minimize transitions in a digital data string after run length limiting processing as well as to achieve the above-described effects of run length limiting and balancing the occurrence frequencies of "0" and "1".

In this case, the method of searching for a specific symbol P which minimizes transitions in a digital data string after exclusive OR operations from a plurality of symbols which match neither input symbols nor the inverted ones of the input symbols and remain in the candidate list is the same as the method described above with reference to FIGS. 5 to 8.

FIG. 15 is a flowchart in which processing actions of searching for the specific symbol P which minimizes transitions in a digital data string after exclusive OR operations from all symbols which match neither input symbols nor the inverted ones of the input symbols and remain in the candidate list are summarized.

In FIG. 15, the same steps are denoted by the same reference characters as those in FIG. 8, and the description on FIG. 15 will be given. In step S42 subsequent to step S13, symbols each having a pattern which matches an input symbol and symbols each having a pattern which matches the inverted one of the input symbol are removed from a candidate list (including 1024 patterns which can be created for 10-bit data) prepared in advance for searching for the specific symbol P by the symbol P search module 18c1, and the process proceeds to step S15.

The various modules of the systems described herein can be implemented as software applications, hardware and/or software modules, or components on one or more computers, such as servers. While the various modules are illustrated separately, they may share some or all of the same underlying logic or code.

While certain embodiments of the inventions have been described, these embodiments have been presented by way of example only, and are not intended to limit the scope of the inventions. Indeed, the novel methods and systems described herein may be embodied in a variety of other forms; furthermore, various omissions, substitutions and changes in the form of the methods and systems described herein may be made without departing from the spirit of the inventions. The accompanying claims and their equivalents are intended to cover such forms or modifications as would fall within the scope and spirit of the inventions.

What is claimed is:

1. A run length limiter comprising:
a searcher configured to search, for a specific symbol, in a plurality of symbols having a larger number of patterns than the number of symbols included in input digital data, the specific symbol not coinciding with each symbol in the input digital data and having a pattern that ensures a minimum number of transitions of digital data obtained by exclusive OR operation of the specific symbol and the input digital data, the pattern of the specific symbol being set such that a transition of the specific symbol is present at a bit position at which each of the symbols of the input digital data tends to exhibit a larger number of transitions, and the transition of the specific symbol is absent at a bit position at which each of the symbols of the input digital data tends to exhibit a smaller number of transitions;
an operator configured to execute the exclusive OR operation of the specific symbol and the digital data; and
an output module configured to output the exclusive OR operated digital data, along with the specific symbol.

2. The run length limiter of claim 1, wherein
the specific symbol has the same number of bits as each symbol of the input digital data.

3. The run length limiter of claim 1, wherein
the searcher is configured to search, for the specific symbol, a plurality of symbols each of which does not match any symbol of the digital data, or an inverted one of the symbols of the digital data.

4. The run length limiter of claim 3, wherein
the output module does not output a bit located at a preset position when outputting the specific symbol searched by the searcher.

5. The run length limiter of claim 1, wherein
the output module is configured to divide the exclusive OR operated digital data into a plurality of blocks each including a plurality of symbols, and to selectively output the exclusive OR operated digital data and inverted digital data of the exclusive OR operated digital data such that occurrence frequencies of "0" and "1" are balanced for each divided block.

6. The run length limiter of claim 5, wherein
the output module is configured to additionally output, for each divided block, an inversion information bit indicating whether the exclusive OR operated digital data is output or the inverted digital data of the exclusive OR operated digital data is output.

7. A run length limiter comprising:
a searcher configured to search, for a specific symbol, in a plurality of symbols having a larger number of patterns than the number of symbols included in input digital data, each of the plurality of symbols having a particular one bit fixed to "0" or "1," the specific symbol not coinciding with each symbol in the input digital data or a signal obtained by inverting each symbol in the input digital data, and having a pattern that ensures a minimum number of transitions of digital data obtained by exclusive OR operation of the specific symbol and the input digital data, the pattern of the specific symbol being set such that a transition of the specific symbol is present at a bit position at which each of the symbols of the input digital data tends to exhibit a larger number of transitions, and the transition of the specific symbol is absent at a bit position at which each of the symbols of the input digital data tends to exhibit a smaller number of transitions;
an operator configured to execute the exclusive OR operation of the specific symbol and the digital data; and
an output module configured to output the exclusive OR operated digital data, along with the specific symbol from which the particular one bit is eliminated.

8. An information recorder comprising:
a searcher configured to search, for a specific symbol, in a plurality of symbols having a larger number of patterns than the number of symbols included in input digital data, the specific symbol not coinciding with each symbol in the input digital data and having a pattern that ensures a minimum number of transitions of digital data obtained by exclusive OR operation of the specific symbol and the input digital data, the pattern of the specific symbol being set such that a transition of the specific symbol is present at a bit position at which each of the symbols of the input digital data tends to exhibit a larger number of transitions, and the transition of the specific symbol is absent at a bit position at which each of the symbols of the input digital data tends to exhibit a smaller number of transitions;

an operator configured to execute the exclusive OR operation of the specific symbol and the digital data; and an output module configured to output the exclusive OR operated digital data, along with the specific symbol;

an information recording medium; and a recorder configured to record the output digital data on the information recording medium.

9. The information recorder of claim 8, wherein the information recording medium is a magnetic recording medium.

10. An information recorder comprising:

a host unit;

a searcher configured to search, for a specific symbol, in a plurality of symbols having a larger number of patterns than the number of symbols included in input digital data, the specific symbol not coinciding with each symbol in the input digital data and having a pattern that ensures a minimum number of transitions of digital data obtained by exclusive OR operation of the specific symbol and the input digital data, the pattern of the specific symbol being set such that a transition of the specific symbol is present at a bit position at which each of the symbols of the input digital data tends to exhibit a larger number of transitions, and the transition of the specific symbol is absent at a bit position at which each of the symbols of the input digital data tends to exhibit a smaller number of transitions;

an operator configured to execute the exclusive OR operation of the specific symbol and the digital data; and an output module configured to output the exclusive OR operated digital data, along with the specific symbol;

an information recording medium; and a recorder configured to record the output digital data on the information recording medium.

11. A run length limiting method comprising:

searching, for a specific symbol, in a plurality of symbols having a larger number of patterns than the number of symbols included in input digital data, the specific symbol not coinciding with each symbol in the input digital data and having a pattern that ensures a minimum number of transitions of digital data obtained by exclusive OR operation of the specific symbol and the input digital data, the pattern of the specific symbol being set such that a transition of the specific symbol is present at a bit position at which each of the symbols of the input digital data tends to exhibit a larger number of transitions, and the transition of the specific symbol is absent at a bit position at which each of the symbols of the input digital data tends to exhibit a smaller number of transitions;

executing the exclusive OR operation of the specific symbol and the digital data; and outputting the exclusive OR operated digital data, along with the specific symbol.

* * * * *